United States Patent [19]

Coyle

[11] 4,340,803
[45] Jul. 20, 1982

[54] METHOD FOR INTERCONNECTING SOLAR CELLS

[75] Inventor: Peter J. Coyle, Maple Shade, N.J.

[73] Assignee: RCA Corporation, New York, N.Y.

[21] Appl. No.: 96,142

[22] Filed: Nov. 20, 1979

[51] Int. Cl.³ .................. B23K 11/16; B23K 11/32
[52] U.S. Cl. ............................ 219/56.22; 219/86.9
[58] Field of Search ............... 219/56.1, 56.21, 56.22, 219/86.9, 87, 91.2; 29/572

[56] References Cited
U.S. PATENT DOCUMENTS

| | | | |
|---|---|---|---|
| 2,042,899 | 6/1936 | Howland. | |
| 2,468,647 | 4/1949 | Watter. | |
| 2,540,180 | 2/1951 | Wirt. | |
| 3,349,218 | 10/1967 | Hill | 219/56.21 |
| 3,435,184 | 3/1969 | Schroeppel et al. | 219/56.21 |
| 3,459,918 | 8/1969 | Rzant | 219/56.21 |
| 3,558,847 | 1/1971 | Width | 219/87 |
| 3,833,426 | 9/1974 | Mesch | 29/572 X |
| 4,041,271 | 8/1977 | Lorans | 219/86.25 |
| 4,171,477 | 10/1979 | Funari | 219/56.21 |

OTHER PUBLICATIONS

*IBM Technical Disclosure Bulletin*, vol. 5, No. 9, Feb. 1963, pp. 16–17, "Resistance Welder for use with Thin Films", by B. Hairabedian.

*Primary Examiner*—J. V. Truhe
*Assistant Examiner*—Keith E. George
*Attorney, Agent, or Firm*—Birgit E. Morris; Donald S. Cohen; Allen Bloom

[57] ABSTRACT

A method for interconnecting the body of a solar cell to an adjacent solar cell to form a solar cell array capable of withstanding high temperatures and rugged terrestrial applications, but minimizing the electrical degradation of the peak power output of the solar cells comprises the parallel gap welding of an interconnect metal layer perpendicular to the direction of force applied on the solar cell by the interconnect layer connecting adjacent solar cells wherein the width of the weld perpendicular to the direction of force is greater than the length of the weld.

8 Claims, 5 Drawing Figures

METHOD FOR INTERCONNECTING SOLAR CELLS

The present invention relates to solar cells. More particularly, the present invention relates to a process of interconnecting solar cells into a solar array.

BACKGROUND OF THE INVENTION

Photovoltaic devices such as solar cells are capable of converting solar radiation into usable electrical energy. The energy conversion occurs as a result of what is well-known in the solar cell field as the photovoltaic effect. The magnitude of the photovoltage and photocurrent from a single solar cell is insufficient for practical applications such as powering electrical motors, communications, and the like. Therefore, a plurality of solar cells are normally interconnected in what is known as a solar array to provide sufficient voltage and current for useful applications. The solar cells are connected in series in a solar array when a higher voltage is needed or in parallel when a higher current is needed. Depending upon the use, solar cells may be both connected in parallel and in series in a single solar cell array.

The solar cells can be interconnected by soldering an interconnect layer of a suitable metal, such as copper or silver, between adjacent solar cells. However, solder interconnects are subject to thermal degradation and generally exhibit low peel strengths at high temperatures which render them unsuitable in solar arrays which operate at above about 185° C. temperatures, such as solar concentrators or in applications which require high peel strengths such as military space applications or terrestrial applications where the solar cell array is anticipated to be subjected to a high degree of abuse.

A welded interconnect can withstand high temperatures and abuse; however, general welding techniques can crack the microstructure of the solar cell, and can cause the migration of metal from the metalization layers to the solar cell structure, which results in a general degradation of the electrical output of each individual solar cell in the solar array. Electrical degradation due, inter alia, to microcracking and diffusion of metals from the metalization layers during the welding operation is defined as the percentage decrease in the peak power output of an illuminated solar cell. The degradation is thought to be caused by localized junction damage caused by the welding process.

Thus, it would be highly desirable to have a method of interconnecting solar cells which does not crack the microstructure of the solar cell, or degrade the performance of the solar array, and, in addition, can withstand high temperatures and provide an interconnect with high peel strength to withstand harsh space and rugged terrestrial applications.

SUMMARY OF THE INVENTION

A process for interconnecting solar cells to form a solar array comprising the parallel gap welding of an interconnect metal strip between adjacent solar cells wherein the ratio of the tip electrode resistance to the interconnect resistance of the metal strip is maintained at a ratio of 10:1 or greater, and the width of the weld perpendicular to the direction of peel stress forces is greater than the length of the weld in the direction of the peel stress force. The welded solar array of the invention can withstand temperatures in excess of 186° C., and forces which exert high peel strengths between the solar cells in the array. The process further minimizes the degrading effects of interconnecting the solar cells by welding.

DETAILED DESCRIPTION OF THE INVENTION

Figure 1:
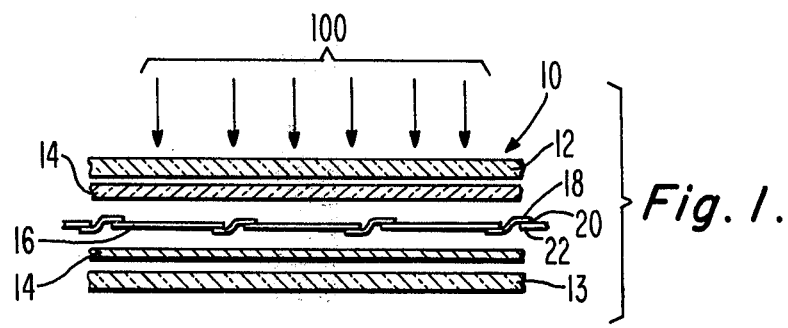
FIG. 1 illustrates a cross-sectional view of a series of solar cells interconnected into a solar array.

The invention will be put into perspective by referring to FIG. 1 which illustrates the interconnection of a plurality of solar cells into a solar array 10. Solar radiation 100 impinging upon the solar array 10 is a reference point for the incident surface of each layer of the solar array.

The solar array 10 includes a top protective sheet 12 which is transparent to solar radiation, such as acrylic plastic or glass, and a bottom protective sheet 13 of a transparent material such as glass, or other protective material, such as aluminum. The top protective sheet 12 and the bottom protective sheet 13 are bonded to a series of solar cells 16 with a transparent glue 14 of polyvinylbutyrate or other suitable material. The solar cells 16 are interconnected with metal interconnect strips 18 between the metalized portion 20 of the solar cells and the back contact 22.

Figure 2:
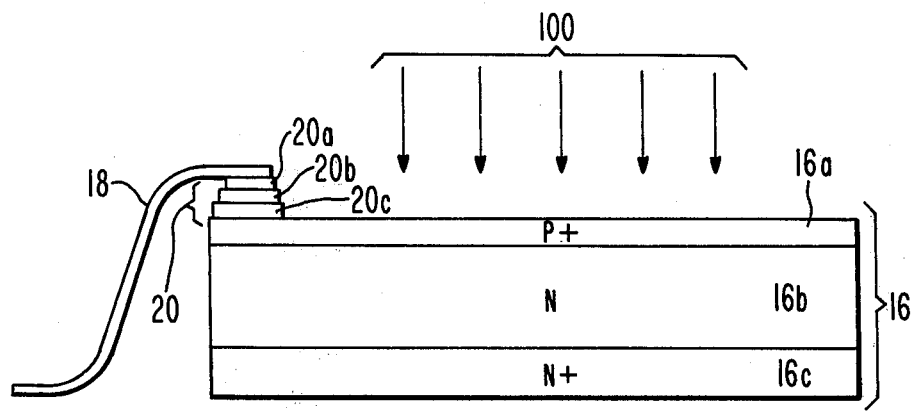
FIG. 2 illustrates a cross-sectional view of a solar cell with a metal interconnect parallel gap welded thereon.

FIG. 2 illustrates a blow-up of a solar cell 16, the metal interconnect 18, and the metalized portion of the solar cell 20. The solar cell 16 includes regions of differing conductivity type 16a, 16b, and 16c. For purposes of illustration, the solar cell 16 has an incident region 16a of $p^+$-type conductivity, a region 16b contiguous to region 16a of N-type conductivity, and a region 16c, opposite to incident region 16a and contiguous to region 16b, of $N^+$-type conductivity. Region 16a forms a shallow PN junction with layer 16b at a distance of about 1000 angstroms from the surface of region 16a, i.e., region 16a has a thickness of about 1000 angstroms (0.1 micrometer). Other solar cell structures known in the art, such as Schottky barrier, NP, and PIN structures can be interconnected by the present method also.

The solar cell 16 has a contact metal 20c of titanium or other suitable material which ohmically contacts region 16a to collect the current generated by the solar cell during radiation of the solar cell with solar radiation 100. The contact metal 20c is disposed on the solar cell 16 in a grid pattern or other suitable pattern. A barrier metal layer 20b of palladium or other suitable material is deposited on the contact metal layer 20c. Layer 20b prevents any galvanic action between the contact metal layer 20c and the top contact metal 20a, of silver or other suitable material. The top contact 20a also forms an integral bus bar for the solar cell 16. The metal interconnect strip 18 of copper or other suitable material is parallel gap welded to the top contact metal layer 20a. If contact metal layer 20c and interconnect strip 18 are selected such that there is no galvanic action between said metals, the barrier metal layer 20b and top contact metal layer 20c are unnecessary.

The interconnection of one solar cell to another solar cell with metal interconnect strip 18 must be performed so as to minimize the microcracking of the semiconductor material due to thermal shock of the welding pulse. In addition, to withstand the harsh environments of space and remote terrestrial applications, the bond strength of the interconnection must be equal to or greater than stresses which would induce failure in the semiconductor material of the solar cell. Furthermore, the weld area and the area heated by the welding process must be minimized.

A modified parallel gap welding process satisfies the requirements of strength and heat resistance and minimum solar cell degradation. The welding process is defined as the formation of bonds by positioning two parallel electrodes with a variable gap over the metalization on the solar cell with a specified force applied. The power supply delivers a direct current (DC) of varying magnitude while maintaining a constant voltage drop across the electrodes for a specified increment of time. The DC current varies as the reciprocal of the overall weldment resistance change. The weldment is defined as the welding system, e.g., a copper strip welded to a silver contact. There are two important parameters in parallel gap welding, electrode/interconnect contact resistance and electrode tip resistance. The electrode/interconnect contact resistance is a function of force of the electrodes on the interconnect and the solar cell. The system resistance (R) is sensitive to surface conditions such as surface oxides, contaminates, electrode and solar cell surface topography, and interconnect material. The electrode tip resistance ($R_T$) is adjusted by altering the geometry of the electrode tip. Reducing the length or increasing the cross-sectional area of the tip decreases $R_T$ and the joulean heating ($I^2R$) of the tip. $R_T$ increases as the weld pulse progresses and the tips heat up. The gap between the electrodes determines the interconnect electrical resistance ($R_{IC}$) and the total area of the bond. Crystalline silicon tends to crack at tip pressures of about 6000 pounds per square inch (PSI) (421.86 kg f/cm$^2$) The tip pressure on the silicon effects the system resistance (R). R decreases with increasing tip pressure. A tip pressure of about 4000 PSI (281.24 kg f/cm$^2$) has been determined to be the preferred pressure as a compromise between minimum contact resistance and safe stress limits for a semiconductor material such as crystalline silicon. The electrode tip pressure should be high enough to assure a good contact between the metal interconnect but less than the pressure at which the crystalline semiconductor material in the solar cell will crack. The tip resistance decreases as the tip is consumed in the welding process. Annealing the interconnection before welding decreases the metalization to interconnect resistance and strengthens the bond therebetween.

The interconnect to electrode tip temperature ratio, should be maintained at a ratio of about 60:1 or greater to ensure localization of the heat to the desired weld zone. To achieve the interconnect to electrode tip temperature ratio, the $R_T/R_{IC}$ ratiio should be maintained at a ratio of at least 10:1 and preferably greater than 15:1. Also the thermal mass ratio between the interconnect and electrode tip should be maintained at 1:1 or less. For example, to maintain an overall $\Delta_T$ ratio of greater than about 60:1 given an electrical tip resistance to interconnect resistance ratio of 10:1, the thermal mass ratio should be about 1:6 or less.

The interconnect to electrode tip temperature ratio, i.e., $R_T/R_{IC}$ (which will be called $T_T$ hereinafter) should be at least 10:1 as specified above. Similarly, the thermal mass ratio between the interconnect and the electrode tip (which will be called $M_T$ hereinafter) was specified to be about 1:6 or 1/6. Accordingly, the ratio between the electrode tip resistance, $T_T$, and the thermal mass ratio, $M_T$, is equal to $T_T/M_T$ or $(10)/(1/6)$ or about 60:1. Similarly, if $T_T$ is about 15:1 and $M_T$ is about 1:4, the ratio of $T_T/M_T$ is $(15)/(\frac{1}{4})$ or about 60:1.

Figure 3:
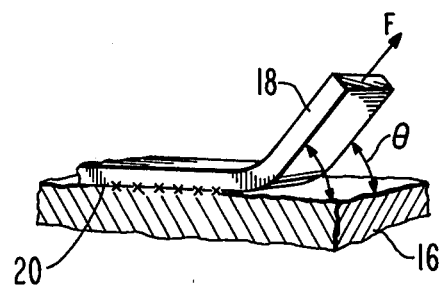
FIG. 3 illustrates the direction of pull of the force on a metal interconnect between solar cells.

Adjusting the parameters of the parallel gap welding apparatus permits the interconnection of solar cells into a solar array with a minimum amount of degradation of the individual cells. To achieve a high peel strength of the given weld while minimizing the weld area, and thus minimizing the degradation of the cell, the weld must be oriented so that the width of the weld perpendicular to the direction in which force will be applied to pull the joint apart is greater than the length of the weld. Preferably the width is about 4 times greater than the length of the weld. FIG. 3 illustrates a solar cell 16 with the interconnect weld, depicted with X's between the metal interconnect layer 18 and the solar cell metalization 20. The direction of the pull of the force for the peel strength is indicated by $\theta$. In the interconnection of solar cells, the angle of the interconnect will vary from between 0° to about 60° and preferably to about 45° for $\theta$.

Figure 4:
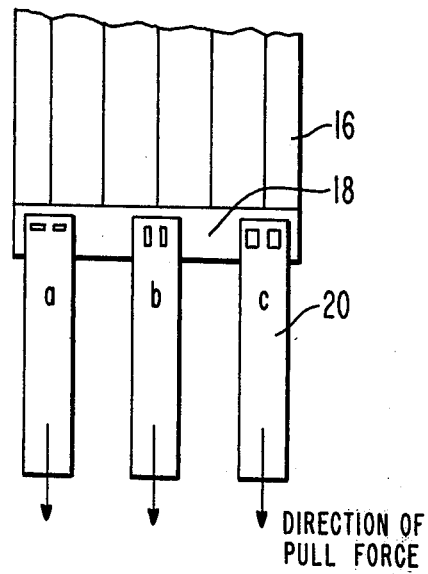
FIG. 4 illustrates various weld configurations of a metal interconnect which has been parallel gap welded onto a solar cell.

FIG. 4 illustrates weld orientations. Weld 4a illustrates two welds which were oriented in line with each other and perpendicular to the direction of force exerted on the metal interconnect 18 and the solar cell 16 incorporating the metalization 20. The area over which the force must act as maximized while the weld area is minimized. Increasing the area by making the welds wider, as illustrated in weld 4c, does not increase the peel strength because the force acts on the area of the line perpendicular to the axis of the pull of the force. However, the increased area of the weld in FIG. 4c increases the amount of degradation introduced into the solar cell structure by the welding process. Weld 4b, although providing a comparable degradation of the solar cell structure with the orientation of weld 4a, has the lowest ratio of peel resistance to weld area.

The average area of the preferred weld configuration, weld 4a, is about 0.125"×0.013" (0.318cm×0.033 cm). A weld area of this size provides more than adequate electrical conduction with respect to the solar cell output power, since the area is more than 4 times that of the cross-sectional area of the interconnect.

The welds illustrated in FIG. 4 can be formed with either large tip area electrodes, 0.025"×0.045" (0.064 cm×0.114 cm) or small tip area electrodes, 0.015"×0.025" (0.038 cm×0.064 cm). The larger tip area electrodes are preferred because the weld 4a can be formed with two weld pulses instead of three weld pulses for the smaller electrodes. The fewer the number of welds, the less heating of the solar cell structure, and hence the less the degradation. The peak tip temperature during welding is minimized by maintaining a high interconnect to electrode tip resistance temperature ratio. In addition, the higher tip temperature, coupled with 50 percent more weld pulses per interconnect, will result in an accelerated wear rate for the small electrodes.

Figure 5:
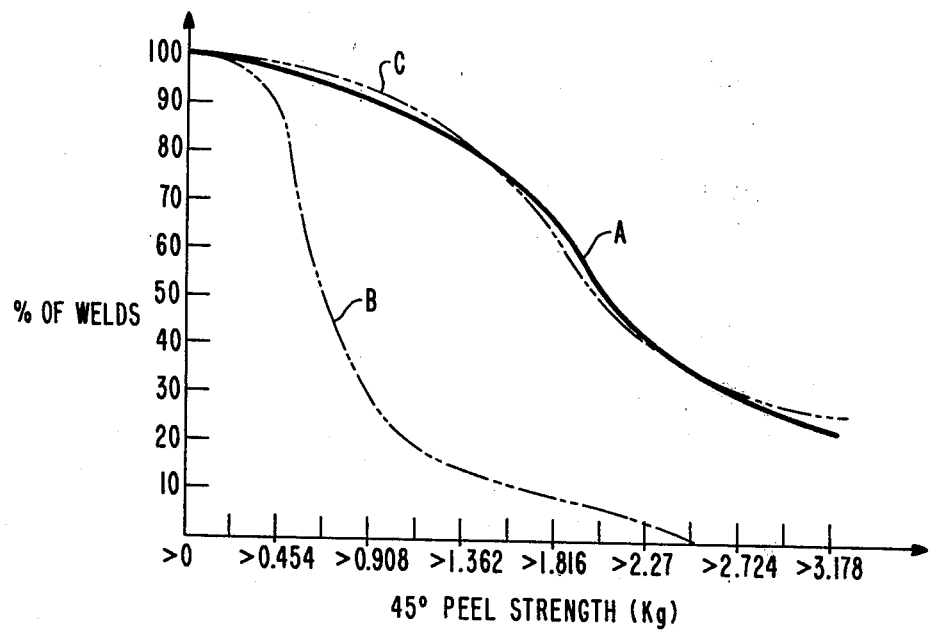
FIG. 5 illustrates the peel strengths of the weld configuration of FIG. 4.

FIG. 5 illustrates the peel strength of the weld orientations, 4a, 4b, and 4c in FIG. 4. Weld orientation 4b, although comparable to weld 4a in solar cell degradation, forms a weaker bond than 4a or 4c. Weld 4c is comparable to weld 4a but, due to the increased number of weld pulses and weld area, the solar cell performance is degraded due to the increased heating by the greater number of weld pulses needed to form 4c.

Having described the invention, the following specific examples will help to illustrate the invention. However, it is to be understood that the invention is not limited to the specifics of the examples described herein. Other modifications which would be obvious to one of ordinary skill in the art are intended to be within the scope of the invention.

EXAMPLE 1

A solar cell manufactured by Optical Coating Labs, Inc. having an area 2 cm × 4 cm was placed in a welding jig for the parallel gap welding of a copper-metal interconnect with a width of about 0.125" (0.318 cm) and a thickness of about 0.003" (0.0076 cm) to the solar cell. The copper interconnect was welded to the solar cell using a Hughes Corporation VTA-66 weld head, specifically designed for parallel gap welding, with a Hughes MCW-55 constant voltage power supply. The welding was performed with electrodes having dimensions of 0.025" × 0.45" (0.064 cm × 0.114 cm) with a gap of about 0.008" (0.0203 cm) between the two electrodes. The voltage applied across the tip was about 0.52 volt for a duration of about 110 milliseconds. The welding head was adjusted so as to provide a weld having the configuration illustrated in FIG. 4, weld 4a. The average area of the weld was about 0.125" × 0.013" (0.318 cm × 0.033 cm). Two pulses of the parallel gap device were necessary to provide the previously mentioned weld zone area. After welding, the solar cell was tested for degradation by illuminating the solar cell with lights and measuring the power output with respect to the measured power output of the cell prior to welding. The solar cell had been degraded by about 0.7 percent during the welding operation.

The interconnect was pulled at an angle of about 45° from the surface of the solar cell until the copper interconnect was separated from the solar cell, i.e., destructive failure, to determine the peel strength. The solar cell with the welded interconnect exhibited a peel strength of about 4 pounds.

EXAMPLES 2-5

The solar cell in Example 1 and four more solar cells, examples 2-5, were welded from 1-8 times in accordance with the procedure outlined in Example 1. There were two weld pulses for each weld number. After each weld the solar cells were measured for the percentage of degradation caused by the welding process. The results are given below in Table I.

TABLE I

| Weld No. | % Degradation (Cumulative) | | | | |
|---|---|---|---|---|---|
| | Cell #1 | Cell #2 | Cell #3 | Cell #4 | Cell #5 |
| 1 | 0.7 | 1.0 | .8 | 0 | .5 |
| 2 | 1.9 | 1.7 | 1.9 | 0 | 1.7 |
| 3 | 2.7 | 2.3 | 2.5 | .2 | 2.5 |
| 4 | 3.4 | 3.2 | 3.5 | .4 | 3.1 |
| 5 | 4.5 | 4.4 | 4.7 | .8 | 3.9 |
| 6 | 5.4 | 5.3 | 5.8 | 1.1 | 5.1 |
| 7 | 6.0 | 6.1 | 6.5 | 1.1 | 6.0 |
| 8 | 6.7 | 7.1 | 7.3 | 1.5 | 6.6 |

The results indicate that as the weld area increases, the performance of the solar cell decreases.

I claim:

1. A process for welding an interconnect to a solar cell, comprising:
   positioning a solar cell in a parallel gap welding apparatus to weld a metal interconnect to the solar cell such that the width of the weld perpendicular to an applied pulling force will be greater than the length of the weld in the direction of said applied pulling force;
   adjusting the parameters of the electrode tip resistance to the metal interconnect resistance to a ratio of at least about 10:1 or greater, and said electrical tip resistance to metal interconnect resistance to the thermal mass ratio of the metal interconnect to the tip of said parallel gap welding apparatus of about 60:1;
   applying at least one weld pulse with a constant voltage across the welding tips at said parallel gap welding apparatus for a sufficient time to weld said metal interconnect directly to the metallization of said solar cell whereby the welds thus formed are capable of withstanding temperatures in excess of about 185° C.

2. The process according to claim 1 wherein the electrode tip resistance to interconnect resistance ratio is greater than about 15:1.

3. The process according to claim 1 wherein about two weld pulses per interconnect are applied to the metal layer to weld it to the solar cell.

4. The method according to claim 3 wherein the dimensions of each weld are about 0.318 cm × 0.333 cm.

5. The process according to claim 1 wherein the dimensions of the electrode tips are about 0.064 cm × 0.114 cm.

6. The process according to claim 5 wherein the voltage across the electrode tips is about 0.52 volt, the gap between the tips is about 8 mils, and the pulse duration is about 110 milliseconds.

7. A solar cell having a welded interconnect formed according to the process of claim 1.

8. A solar cell array comprising a plurality of solar cells connected in series or in parallel with an adjacent solar cell wherein said solar cells are interconnected by means of a parallel gap weld apparatus to form a metal interconnect between said solar cells, wherein said parallel gap weld apparatus is adjusted to have an electrode tip resistance to metal interconnect resistance ratio of at least about 10:1 or greater, and an electrical resistance ratio of the thermal mass ratio of metal interconnect to the parallel gap welding tip of about 60:1.

* * * * *